July 26, 1960 A. HERLET 2,946,709

POWER TRANSISTOR WITH MONOCRYSTALLINE SEMICONDUCTOR BODY

Filed July 21, 1958

2,946,709

POWER TRANSISTOR WITH MONOCRYSTALLINE SEMICONDUCTOR BODY

Adolf Herlet, Pretzfeld, Germany, assignor to Siemens-Schuckertwerke Aktiengesellschaft, Berlin-Siemensstadt, Germany, a corporation of Germany Filed July 21, 1958, Ser. No. 749,706

Claims priority, application Germany July 23, 1957

10 Claims. (Cl. 148—33)

My invention relates to a power transistor with a monocrystalline semiconductor body which possesses at least two highly doped, relatively large areas of a given conductance type and between these a less highly doped basis area of the opposite conductance type bordering the two other areas at respective p-n-junctions.

Compared with known transistors of this type, it is a main object of my invention to devise a more compact and more efficient power transistor particularly suitable for use as a switching transistor of high current-controlling duty and great power amplification. More specifically, the invention aims at increasing the inverse (blocking) voltage of the collector-adjacent p-n-junction and simultaneously obtaining highest possible current amplification.

To achieve these objects and in accordance with my invention, I dimension the specific electric resistance $\rho$ (in ohm·cm.) of the semiconductor material in the basis area and the thickness W (in cm.) of this basis area relative to each other so that the ratio of specific resistance to thickness is approximately equal to:

$$\rho/W \approx \frac{1}{\epsilon_0 \epsilon \mu E_k} \text{ohm}$$

wherein:

$\epsilon_0$ denotes the influence coefficient=8.86.10$^{-14}$ amp. second/volt cm.

$\epsilon$=dielectric constant (dimensionless) of the semiconductor material, $\mu$=mobility of the majority carriers in the basis area, in cm.$^2$/volt second; and $E_k$=critical electrical field strength, in volt/cm., of the semiconductor material forming the monocrystalline body.

The following tabulation indicates the corresponding numerical values.

| | Germanium | | Silicon | |
|---|---|---|---|---|
| $\epsilon$ | 16 | | 12 | |
| $E_k$ | c. 2.10 $^5$ | | c. 2.10 $^5$ | |
| | n-type | p-type | n-type | p-type |
| $\mu$ | 3,600 | 1,800 | 1,500 | 500 |

The values of $\mu$, as well as the values of $\rho$ mentioned and represented herein below, apply to approximately 300° Kelvin.

The invention and the underlying concepts will be further explained with reference to the drawing in which.

Although the invention is described below in conjunction with the example of silicon transistors, the invention is analogously applicable to power transistors of germanium or other semiconductor substances having a diamond type lattice structure, such as is the case with indium antimonide, indium arsenide and the other semiconducting $A_{III}B_V$ compounds known from U.S. Patent 2,798,989 of H. Welker.

Figure 1:
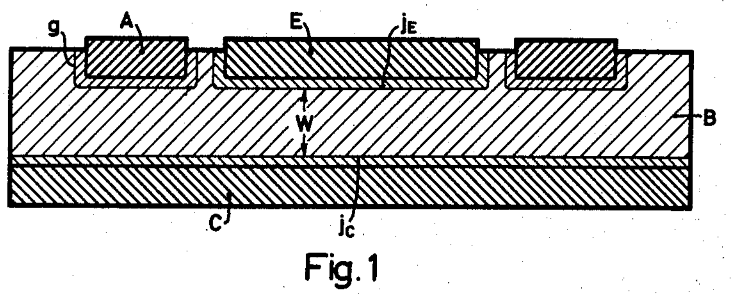
Fig. 1 illustrates schematically in cross section and on enlarged scale, a power transistor according to the invention.

For further explanation reference will be made to the example of an n-p-n transistor illustrated in Fig. 1. The transistor comprises a circular disc consisting of a silicon monocrystal of p-type conductance. Joined with the bottom of the monocrystal is a collector C which is formed by alloying an antimony-containing gold foil together with the monocrystal so as to produce a fusion joint. The collector C thus consists of a coating of metallically conducting, antimony-containing gold-silicon alloy adjacent to a highly doped n-conducting zone which extends up to the collector-adjacent p-n-junction $j_C$. The collector extends over the entire circular area at the bottom of the silicon disc.

Alloyed and fused onto the opposite side of the monocrystal in the same manner and with the same substances is an emitter E of circular shape whose active range extends down to the emitter-side p-n-junction $j_E$. The emitter E covers an area of smaller radius than the collector C and is surrounded by a ring-shaped basis electrode A which may be produced by alloying aluminum into the silicon surface and hence may consist of an aluminum-silicon alloy (silumin). The basis electrode is bordered by a highly p-doped layer which may extend down to the boundary area $g$. The basis electrode forms a barrier-free contact for the remaining, unaffected portion of the silicon disc which forms the basis area B having the thickness W between emitter area and collector area. The transistor, when "open," i.e. nonconducting, may be assumed to operate within the range of "high injection."

By virtue of the invention, requiring that the specific resistance $\rho$ of the monocrystalline semiconductor substance and the thickness W substantially satisfy the value of the above-mentioned ratio, a transistor such as the one described above exhibits a very high blocking voltage together with maximum current amplification. This effect can be explained as follows:

An essential requirement to be met by the transistor when blocked, i.e. operating as an open switch, is to secure a sufficiently high limit of the inverse (blocking) voltage of the p-n-junction $j_C$ at the collector side. This inverse voltage is limited on the one hand by the frontal steepness of the blocking current when a critical electric field strength $E_k$ is attained. This steep front of the ascending current is released either by the so-called Zener effect or by formation of an avalanche of charge carriers due to impact ionization. On the assumption of a uniform lattice-fault density $n_D+$ in the basis area B, there is thus defined a limit voltage $U_B$ with the elementary charge value $e$=1.6·10$^{-19}$ amps. second in accordance with the following equation:

$$U_B = E_k^2 \frac{\epsilon}{8\pi l n_D +} = E_k^2 \frac{\epsilon\mu\rho}{8\pi} \quad (1)$$

Figure 2:
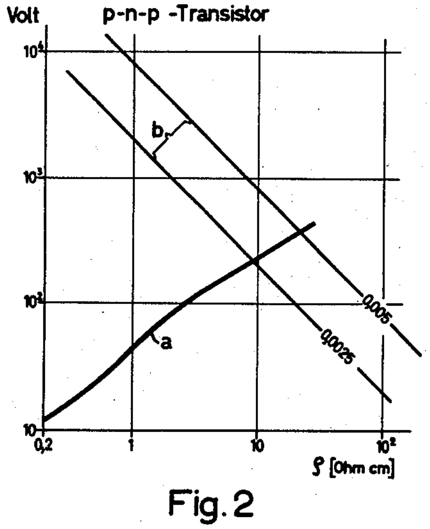
Figs. 2 and 3 are coordinate diagrams indicating various magnitudes of the limits of blocking voltage versus specific resistance in p-n-p and n-p-n silicon power transistors.

The limit voltage $U_B$ increases with a reduction in the amount of doping in the basis area or with an increase in specific resistance of that area. This is apparent from the curves *a* in Figs. 2 and 3. Both curves are based upon measurements of blocking characteristics made with p-n-junctions in silicon bodies. The curve *a* in Fig. 2 is in accordance with McKay, "Avalanche Breakdown in Silicon," Phys. Rev., vol. 94 (1954), pages 877 to 884. Curve *a* in Fig. 3 was published by Herlet and Patalong in "The Blocking Ability of Alloyed Silicon Area Rectifiers," Zeitschrift für Naturforschung, vol. 10*a* (1955), pages 584 and 585.

It may seem to follow that, if the transistor is to remain blocking or "open" up to a voltage U, it would be desirable to give the basis area lowest possible doping, so that, for instance, $$\rho \geq \frac{U \cdot 8\pi}{E_k^2 \epsilon\mu} \text{ or } n_D+ \leq \frac{\epsilon E_k^2}{8\pi l U} \quad (2)$$

This, however, conjures another danger. With decreasing value of $n_D+$, when operating with a predetermined applied voltage in the blocking direction, the space-charge zone near the collector expands into the basis area. This space-charge zone must be prevented from penetrating up to the emitter area because then a steep increase in blocking current would occur at the collector-side p-n-junction. This phenomenon is known as "punch through." The thickness *l* of the space-charge zone therefore must in any event remain smaller than the thickness W of the basis area. The limit voltage thus defined by the punch-through phenomena for $l=W$ is given by the equation $$U_D = \frac{W^2 2\pi l n_D +}{\epsilon} = W^2 \frac{2\pi}{\epsilon\mu\rho} \quad (3)$$

Figure 3:
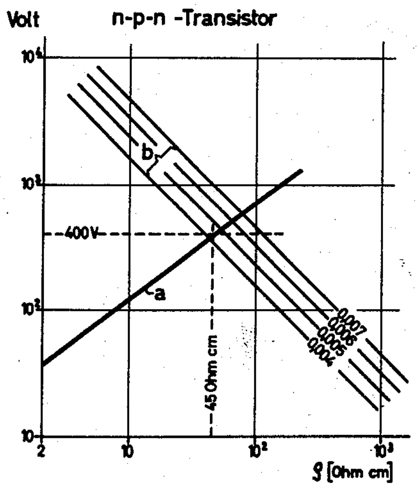

This limit voltage $U_D$, representing an upper limit for the attainable maximum blocking voltage, is represented by the curves *b* in Figs. 2 and 3 for two respective values of the basis thickness W, and results in the requirement:

$$\rho \leq \frac{2\pi W^2}{\epsilon\mu U} \text{ or } n_D+ \geq \frac{\epsilon U}{2\pi l W^2} \quad (4)$$

The two requirements (2) and (4) are compatible only in the area beneath the curves *a* and *b* in Figs. 2 and 3. Therefore, the attainable maximum of blocking voltage $U_{max}$ is obtained for $U_B=U_D$, that is, for the intersection of curve *a* with one of the curves *b* in Figs. 2 and 3. This intersection determines an optimum $\rho$-value of the basis area:

$$\rho_{opt} = \frac{4\pi W}{\epsilon\mu E_k} \quad (5)$$

However, $\rho_{opt}$ is also dependent upon the thickness W of the basis area. By inserting the value (5) into the terms (3), the attainable maximum of the blocking voltage is obtained as:

$$U_{max} = \frac{W}{2} E_k \quad (6)$$

The Equation 5 furnishes a dimensioning rule for the optimum value of the specific resistance of the basis area.

The resulting optimum values of the ratio $\rho/W$ are tabulated below for germanium and silicon.

| Type | Germanium, Ohms | Silicon, Ohms |
|---|---|---|
| n-p-n | 2,500 | 10,000 |
| p-n-p | 1,000 | 3,000 |

Another dimensioning rule can be read from Equation 6. Equation 6 indicates, that for attaining a sufficiently high blocking voltage, the thickness W of the basis area must not be too small. That is, according to Equation 6 the operation of the transistor with the predetermined blocking voltage $U_a$, requires that:

$$W \geq \frac{2U_a}{E_k} \quad (7)$$

The thickness W, on the other hand, is upwardly limited by the median diffusion length L of the charge carriers in this area and is preferably smaller than ⅓L. This requirement can be satisfied the more readily, the larger the diffusion length L of the semiconductor material being used. Since, however, the practically attainable diffusion length is upwardly limited, it is necessary to be satisfied with a relatively small thickness W of the basis area. Under these conditions, the choice of the most favorable value of the specific resistance according to Equation 5 affords best possible performance relative to blocking voltage.

Furthermore, a slight thickness W of the basis area is also of advantage because it secures a high frequency limit or a slight time constant of the transistor.

The following example relates to a silicon transistor fundamentally rated for operation at the normal line voltage (effective voltage) of 220 $v._{eff}$. Considering the corresponding peak voltage of 314 v. and the customary addition made for safety reasons to cope with line-voltage fluctuations, the highest permissible blocking voltage may be set at 400 v. Under these conditions, and in accordance with Figs. 2 and 3 as well as in accordance with Equation 6, a minimum thickness of the basis area of $W=0.004$ cm. is required in accordance with the invention. Since this minimum value does not include any manufacturing tolerance, and since the desired specific resistance can be produced economically only within some range of stray, a further addition may be made for reasons of safety, resulting in the selection of a somewhat greater thickness W of the basis area. Thus, relating to the example of a n-p-n silicon transistor (Fig. 3), a desired blocking voltage of 400 v. for $W=0.005$ cm. is obtained in a $\rho$-range between 45 and 60 ohm cm., and an optimum value of $\rho=53$ ohm cm.; for W=0.006 a $\rho$-range between 45 and 87 ohm cm., and an optimum value of $\rho=65$ ohm cm. are obtained; for $W=0.007$ cm. a $\rho$-range of 45 to 120 ohm cm. with an optimum value at 80 ohm cm. are obtained. For lower blocking voltage the $\rho$-ranges are correspondingly wider.

Due to hardly avoidable inaccuracies or variations in manufacture, it may be necessary to put up with departures of the ratio $\rho/W$ from the optimum value given by Equation 5. Such departures, however, are bearable if they do not exceed the factor 2 upwardly or downwardly. Transistors within this range of tolerance, therefore, are still in accordance with the requirements of my invention. In such cases it is usually preferable to depart from the given thickness W in the upward sense, because the upper limit (curves *b*) is less affected by imperfections in manufacture than the lower limit (curves *a*).

When producing a power transistor according to the invention it is preferable, for obtaining the most favorable value or permissible value range of the specific resistance for a given thickness W of the basis area, to first purify the starting material for the semiconductor body to a higher specific resistance than needed, and to subsequently reduce the specific resistance by applying the proper amount of doping to the purified material.

Suitable methods of producing purifying and doping monocrystals of semiconductor materials are known as such (for example, Handbook of Semiconductor Electronics, edited by Lloyd P. Hunter, McGraw-Hill Book Company, New York, 1956, Section 6, Preparation of Semiconductor Materials, by H. F. Priest) and for that reason are not further described herein.

Figure 4:
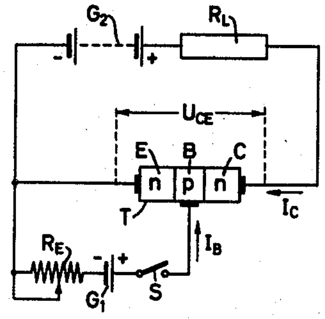
Fig. 4 is a schematic circuit diagram of a device in which a transistor according to the invention operates as a switch.

Fig. 4 illustrates one of the possibilities of using a power transistor according to the invention for controlling the power supply to a load substantially in the manner of an on-off switch. The transistor shown symbolically at T is of the n-p-n type. Its output circuit connected to the emitter E and the collector C, comprises a direct-voltage source $G_2$ and a load resistance $R_L$ in series with each other. The source $G_2$ may supply a voltage of 300 volts, for example, and the value of the load resistance $R_L$ may amount to 100 ohms. The input circuit of the transistor, connected to base B and emitter E, comprises a direct-voltage source $G_1$ whose voltage may be approximately 2 volts, for example, and also an adjustable resistor $R_E$ and a control contact S, both in series with source $G_1$.

Figure 5:
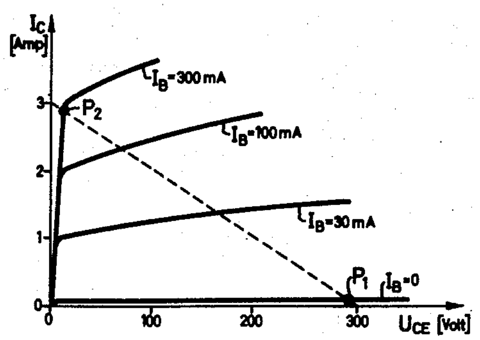
Fig. 5 is a current-voltage coordinance diagram explanatory of the operation of a switching transistor.

The performance of such a device will be explained with reference to the typical current-voltage characteristics illustrated in Fig. 5 in which the ordinate represents the collector current $I_C$ in amps and the abscissa denotes the collector-emitter voltage $U_{CE}$ in volts. The diagram illustrates different curves of the collector current $I_C$ in dependence on respectively different values of the voltage $U_{CE}$ between collector C and emitter E, each curve relating to a different magnitude of the basis current $I_B$. The basis current $I_B$ can be made zero by opening the control contact S, or can be adjusted by means of resistor $R_E$ to different values, for example 30, 100, or 300 milliamps. as indicated for the respective curves in Fig. 5. Also shown in Fig. 5 by a broken line is the linear characteristic of load resistance $R_L$. This straight line intersects the current curve $I_B=0$ at point $P_1$, and the curve $I_B=300$ ma. at point $P_2$. That is, when control contact S is open, the collector current $I_C$ corresponds to point $P_1$ and is negligibly slight, while the voltage $U_{CE}$ between collector and emitter has nearly the full value of 300 volts supplied from the voltage source $G_2$. The transistor T, therefore, when in such "blocked" condition, has the same effect as an open circuit breaker. In contrast, when control contact S is closed and the basis current $I_B$ is adjusted to 300 ma. in accordance with point $P_2$, the output circuit is traversed by a collector current $I_C$ of approximately 3 amps. which produces across load resistance $R_L$ a voltage drop of nearly 300 volts, so that the residual voltage $U_{CE}$ between collector and emitter of transistor T is negligibly slight. The transistor T, when in this "closed" condition, has the same effect as a closed circuit breaker. Consequently, closing and opening of contact S controls the transistor T to pass from "open" or "blocked" condition to the "closed" condition or vice versa. By virtue of the invention, the power loss within the transistor is negligible during blocking condition corresponding to point $P_1$, as well as in the closed condition corresponding to point $P_2$, so that the losses and the heating of the transistor are correspondingly slight. The advantage of such a device resides in the fact that the control contact C is called upon to switch only a negligibly slight amount of power, whereas in the output circuit of the transistor a great multiple amount of power is switched by the transistor.

I claim:

1. A power transistor comprising a monocrystalline semiconductor body having at least two highly doped areas of a given conductance type and a less highly doped basis area of the opposite conductance type intermediate said other two areas and forming respective p-n junctions together therewith the two highly doped areas providing a collector and an emitter respectively, said semiconductor body in said basis area having a specific resistance ($\rho$) and a thickness (W) correlated to each other approximately in accordance with the ratio $$\rho/W=\frac{1}{\epsilon_0\epsilon\mu E_k}\text{ohm}$$

wherein $\rho$ is the specific resistance in ohm cm., W is the thickness in cm., $\epsilon_0$ is the influence coefficient equal to $8.86\cdot10^{-14}$ amp. second/volt cm., $\epsilon$ is the dielectric constant of the semiconductor material (dimensionless), $\mu$ in cm.$^2$/volt second is the mobility of the charge carriers in the basis area, and $E_k$ in volt/cm. is the critical electric field strength of the semiconductor material.

2. A p-n-p power transistor according to claim 1, wherein said semiconductor body is silicon and said ratio $\rho/W$ is approximately equal to 10,000 ohm.

3. An n-p-n power transistor according to claim 1, wherein said semiconductor body is silicon and said ratio $\rho/W$ is approximately equal to 3,000 ohm.

4. A p-n-p power transistor according to claim 1, wherein said semiconductor body is germanium and said ratio $\rho/W$ is approximately equal to 1,000 ohm.

5. An n-p-n power transistor according to claim 1, wherein said semiconductor body is germanium and said ratio $\rho/W$ is approximately equal to 2,500 ohm.

6. In a power transistor according to claim 1 for operation at a given maximum voltage (U) of normal operation, wherein said thickness (W) is at least equal to, and not essentially greater than the value $2U/E_k$.

7. A power transistor comprising a monocrystalline semiconductor body having at least two highly doped areas of a given conductance type and a less highly doped basis area of the opposite conductance type intermediate said other two areas and forming respective p–n junctions together therewith, said semiconductor body in said basis area having a specific resistance ($\rho$) and a thickness (W) correlated to each other so that their ratio is larger than but less than twice the value of $$\rho/W=\frac{1}{\epsilon_0\epsilon\mu E_k}\text{ohm}$$

wherein $\rho$ is the specific resistance in ohm cm., W is the thickness in cm., $\epsilon_0$ is the influence coefficient equal to $8.86\cdot10^{-14}$ amp. second/volt cm., $\epsilon$ is the dielectric constant of the semiconductor material (dimensionless), $\mu$ in cm.$^2$/volt second is the mobility of the charge carriers in the basis area, and $E_k$ in volt/cm. is the critical electric field strength of the semiconductor material.

8. In a power transistor according to claim 7 for operation at a peak voltage of about 400 volt, said thickness being at least 0.004 cm. and at most 0.007 cm.

9. A power transistor comprising a junction power transistor having an amplification factor in the range up to 1, normally characteristic of junction transistors, said transistor comprising a monocrystalline semiconductor body having at least two highly doped areas of a given conductance type and a less highly doped basis area of the opposite conductance type intermediate said other two areas and forming respective p–n junctions together therewith, the two highly doped areas providing a collector and an emitter respectively, said semiconductor body in said basis area having a specific resistance ($\rho$) and a thickness (W) correlated to each other approximately in accordance with the ratio $$\rho/W=\frac{1}{\epsilon_0\epsilon\mu E_k}\text{ohm}$$

wherein $\rho$ is the specific resistance in ohm cm., W is the thickness in cm., $\epsilon_0$ is the influence coefficient equal to $8.86\cdot10^{-14}$ amp. second/volt cm., $\epsilon$ is the dielectric constant of the semiconductor material (dimensionless), $\mu$ in cm.$^2$/volt second is the mobility of the charge carriers in the basis area, and $E_k$ in volt/cm. is the critical electric field strength of the semiconductor material, the maximum thickness (W) of the basis area being less than ⅓ L, L being the median diffusion length of the charge carriers in the basis area, the thickness $l$ of the space-charge zone near the collector being less than the thickness (W), the specific resistance $\rho$ being equal to about $$\frac{4\pi W}{\epsilon\mu E_k}$$

the lattice-fault density $n_D+$ in the basis area being equal to or greater than $$\frac{\epsilon U}{2\pi l W^2}$$

and being equal to or less than $$\frac{\epsilon E_k^2}{8\pi l U}$$

where U is the blocking voltage, the blocking voltage and the "punch-through" voltage being approximately the same, to withstand a high inverse voltage when in the off condition.

10. A system for controlling the power supply to a load in the manner of an on-off switch, comprising a junction power transistor having an amplification factor in the range up to 1, normally characteristic of junction transistors, said transistor comprising a monocrystalline semiconductor body having at least two highly doped areas of a given conductance type and a less highly doped basis area of the opposite conductance type intermediate said other two areas and forming respective p–n junctions together therewith, the two highly doped areas providing a collector and an emitter respectively, said semiconductor body in said basis area having a specific-resistance ($\rho$) and a thickness (W) correlated to each other approximately in accordance with the ratio $$\rho/W=\frac{1}{\epsilon_0\epsilon\mu E_k}\text{ohm}$$

wherein $\rho$ is the specific resistance in ohm cm., W is the thickness in cm., $\epsilon_0$ is the influence coefficient equal to $8.86\cdot10^{-14}$ amp. second/volt cm., $\epsilon$ is the dielectric constant of the semiconductor material (dimensionless), $\mu$ in cm.$^2$/volt second is the mobility of the charge carriers in the basis area, and $E_k$ in volt/cm. is the critical electric field strength of the semiconductor material, the maximum thickness (W) of the basis area being less than ⅓L, L being the median diffusion length of the charge carriers in the basis area, the thickness $l$ of the space-charge zone near the collector being less than the thickness (W), the specific resistance $\rho$ being equal to about $$\frac{4\pi W}{\epsilon\mu E_k}$$

the lattice-fault density $n_D+$ in the basis area being equal to or greater than $$\frac{\epsilon U}{2\pi l W^2}$$

and being equal to or less than $$\frac{\epsilon E_k^2}{8\pi l U}$$

where U is the blocking voltage, the blocking voltage and the "punch-through" voltage being approximately the same, to withstand a high inverse voltage when in the off condition, an output circuit connected to the emitter and collector, the output circuit comprising a direct current voltage source and a load resistance, an input circuit connected to the basis area and the emitter, the input circuit comprising a variable and controllable source of direct voltage.

References Cited in the file of this patent

UNITED STATES PATENTS 2,843,515 Statz et al. ------------- July 15, 1958